US011360838B2

(12) United States Patent
Shimbo et al.

(10) Patent No.: US 11,360,838 B2
(45) Date of Patent: Jun. 14, 2022

(54) ELECTRONIC CONTROL DEVICE AND PREFERENTIAL ERROR DETECTION METHOD OF CONFIGURATION MEMORY

(71) Applicant: Hitachi Automotive Systems, Ltd., Hitachinaka (JP)

(72) Inventors: Kenichi Shimbo, Tokyo (JP); Tadanobu Toba, Tokyo (JP); Taisuke Ueta, Tokyo (JP); Hideyuki Sakamoto, Hitachinaka (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 0 days.

(21) Appl. No.: 16/970,855

(22) PCT Filed: Nov. 20, 2018

(86) PCT No.: PCT/JP2018/042894
§ 371 (c)(1),
(2) Date: Aug. 18, 2020

(87) PCT Pub. No.: WO2019/163227
PCT Pub. Date: Aug. 29, 2019

(65) Prior Publication Data
US 2020/0379831 A1     Dec. 3, 2020

(30) Foreign Application Priority Data
Feb. 21, 2018    (JP) .............................. JP2018-029178

(51) Int. Cl.
*G06F 11/22*     (2006.01)
*G06F 11/07*     (2006.01)
(Continued)

(52) U.S. Cl.
CPC ...... *G06F 11/0763* (2013.01); *G06F 11/1004* (2013.01); *G06F 11/142* (2013.01); *H03K 19/1776* (2013.01)

(58) Field of Classification Search
CPC ............. G06F 11/0763; G06F 11/1004; G06F 11/1008; G06F 11/106; G06F 11/142
See application file for complete search history.

(56) References Cited

U.S. PATENT DOCUMENTS 7,596,744 B1 * 9/2009 Kow .................. G06F 11/1004
                                                        714/819
7,702,978 B2    4/2010 Lewis et al.
(Continued)

FOREIGN PATENT DOCUMENTS

JP    2007-293856 A    11/2007
JP    2011-13829 A    1/2011
(Continued)

OTHER PUBLICATIONS

International Search Report (PCT/ISA/210) issued in PCT Application No. PCT/JP2018/042894 dated Feb. 12, 2019 with English translation (two (2) pages).
(Continued)

*Primary Examiner* — Joseph O Schell
(74) *Attorney, Agent, or Firm* — Crowell & Moring LLP

(57) ABSTRACT

An electronic control device includes a rewritable configuration memory composed of a plurality of frames in which logic circuit information is stored, a reconfiguration control unit configured to rewrite the logic circuit information of the frames, a logic unit configured to form a logic circuit based on the logic circuit information stored in the frames, and a configuration memory diagnosis unit configured to read the logical circuit information stored in the frames of the configuration memory and to perform error detection which is detection of an error in the stored logic circuit information, in which when the frames are rewritten by the reconfiguration control unit, the configuration memory diagnosis unit performs the error detection of ones of the frames that
(Continued)

| | ERROR DETECTION | RECONFIGURATION |
|---|---|---|
| t1 | 0, 1, 2, ··,50 | |
| t2 | 51, 52, 53 | 60-80 |
| t3 | 60, 61, ··, 80 | |
| t4 | 54,55, ··,59 | |
| t5 | 81, 82, ··, 100 | |
| t6 | 0, 1, 2, ··,59 | |
| t7 | 60, 61, ··, 80 | |
| t8 | 81, 82, ··, 100 | |
| t9 | 0,1, 2, ··,59 | |
| t10 | | |

↓ TIME are rewritten prior to ones of the frames that are not rewritten.

6 Claims, 15 Drawing Sheets

(51) Int. Cl.
*G06F 11/10* (2006.01)
*G06F 11/14* (2006.01)
*H03K 19/1776* (2020.01)

(56) References Cited

U.S. PATENT DOCUMENTS

| | | | | |
|---|---|---|---|---|
| 7,795,901 | B1* | 9/2010 | Yang | H03K 19/17756 |
| | | | | 716/128 |
| 8,381,068 | B1* | 2/2013 | Pedersen | H03M 13/093 |
| | | | | 714/773 |
| 8,522,091 | B1* | 8/2013 | White | G06F 11/073 |
| | | | | 714/725 |
| 8,522,126 | B1* | 8/2013 | Chen | G06F 11/004 |
| | | | | 714/807 |
| 8,924,818 | B1* | 12/2014 | Pedersen | H03M 13/093 |
| | | | | 714/763 |
| 2005/0071730 | A1* | 3/2005 | Moyer | H03K 19/17764 |
| | | | | 714/758 |
| 2009/0213946 | A1* | 8/2009 | Dick | G06F 30/34 |
| | | | | 375/260 |
| 2011/0231730 | A1* | 9/2011 | Allen | G06F 12/0246 |
| | | | | 714/758 |
| 2011/0239098 | A1* | 9/2011 | Fisher-Jeffes | H03M 13/091 |
| | | | | 714/807 |
| 2018/0032398 | A1 | 2/2018 | Hasegawa | |
| 2018/0224842 | A1* | 8/2018 | Ichimura | G11C 29/02 |
| 2018/0285192 | A1* | 10/2018 | Meri | G06F 13/4063 |

FOREIGN PATENT DOCUMENTS

| | | |
|---|---|---|
| JP | 2015-115727 A | 6/2015 |
| JP | 2015-142359 A | 8/2015 |
| JP | 2018-22222 A | 2/2018 |
| WO | WO 2015/068285 A1 | 5/2015 |

OTHER PUBLICATIONS

Japanese-language Written Opinion (PCT/ISA/237) issued in PCT Application No. PCT/JP2018/042894 dated Feb. 12, 2019 (three (3) pages).

Japanese-language Office Action issued in Japanese Application No. 2018-029178 dated Jun. 22, 2021 with English translation (four (4) pages).

* cited by examiner

[FIG. 1]
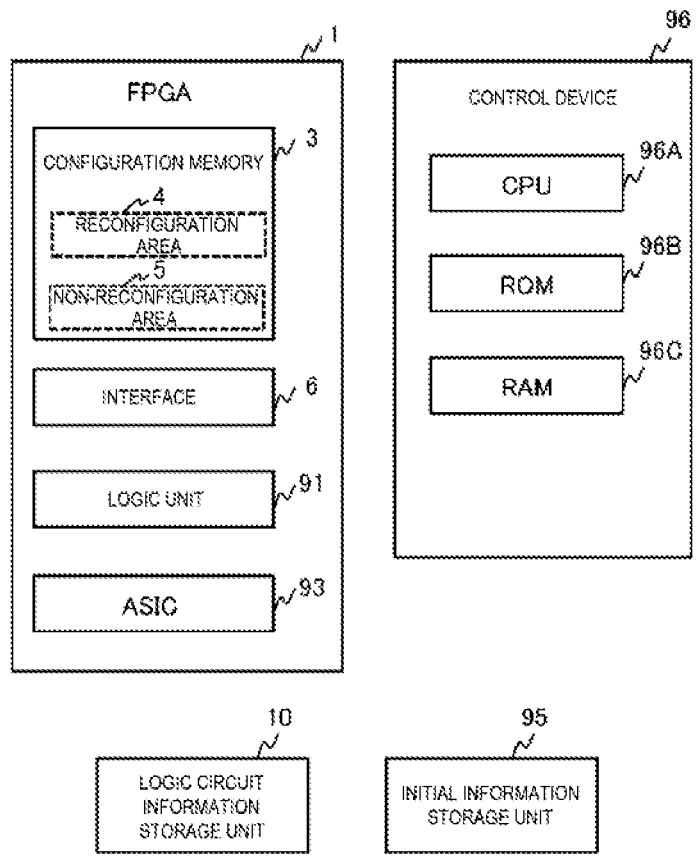
[FIG. 2]
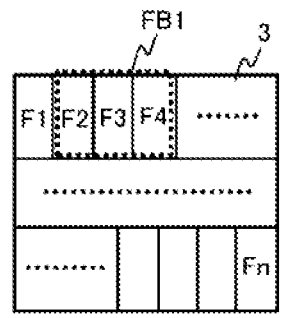

[FIG. 3]
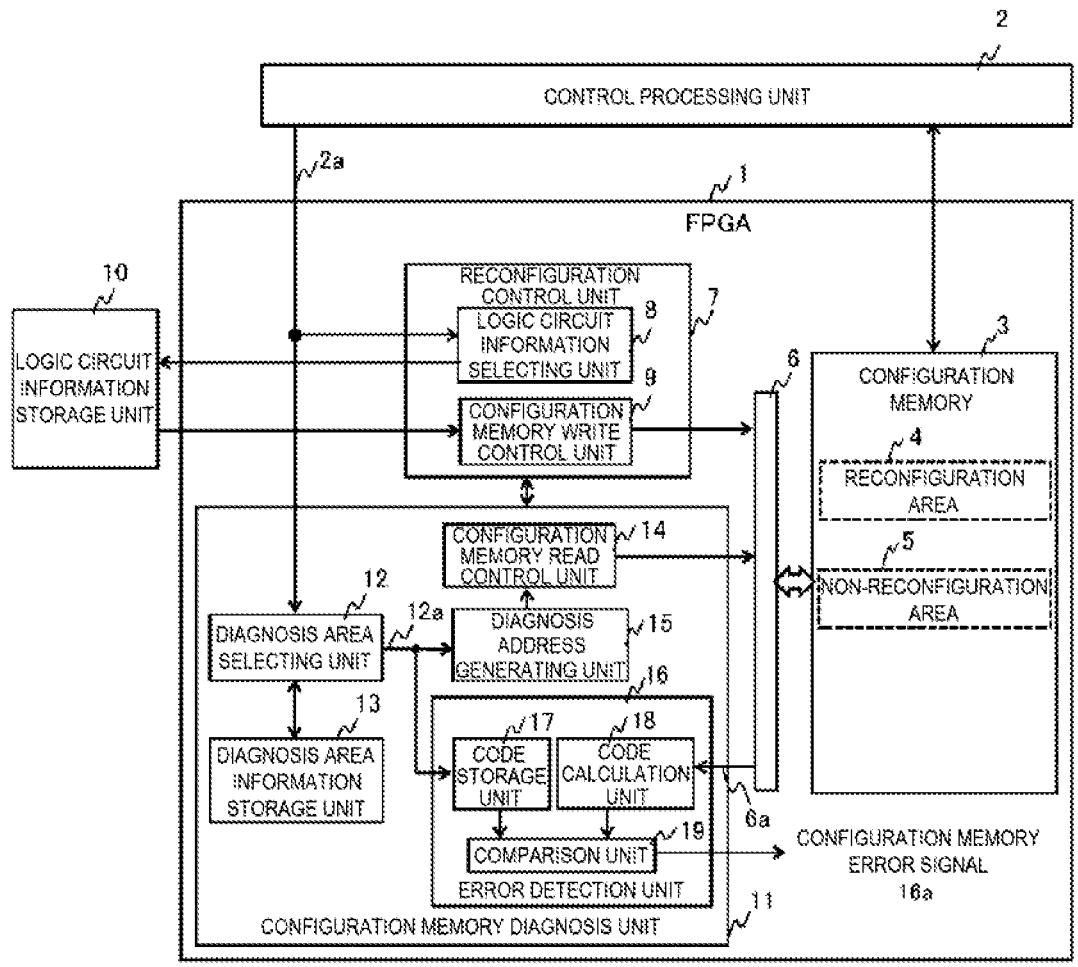
[FIG. 4]

[FIG. 5]
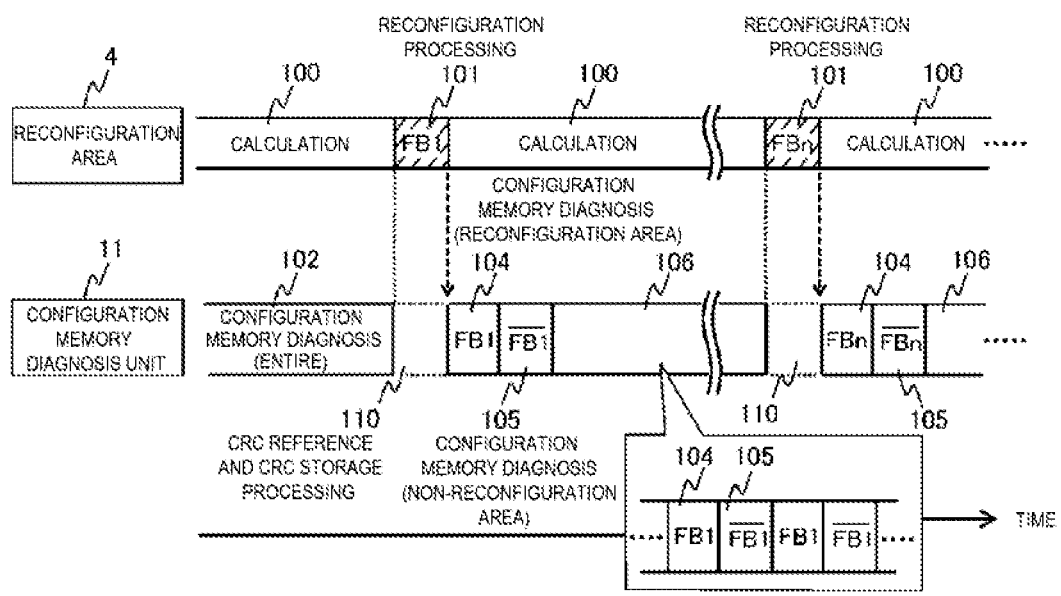
[FIG. 6]

[FIG. 7]

| | ERROR DETECTION | RECONFIGURATION |
|---|---|---|
| t1 | 0, 1, 2, ··, 50 | |
| t2 | | 60-80 |
| t3 | 60, 61, ··, 80 | |
| t4 | 51, 52, ··, 59 | |
| t5 | 81, 82, ··, 100 | |
| t6 | 0, 1, 2, ··, 59 | |
| t7 | 60, 61, ··, 80 | |
| t8 | 81, 82, ··, 100 | |
| t9 | 0, 1, 2, ··, 50 | |
| t10 | | |

TIME

[FIG. 8]
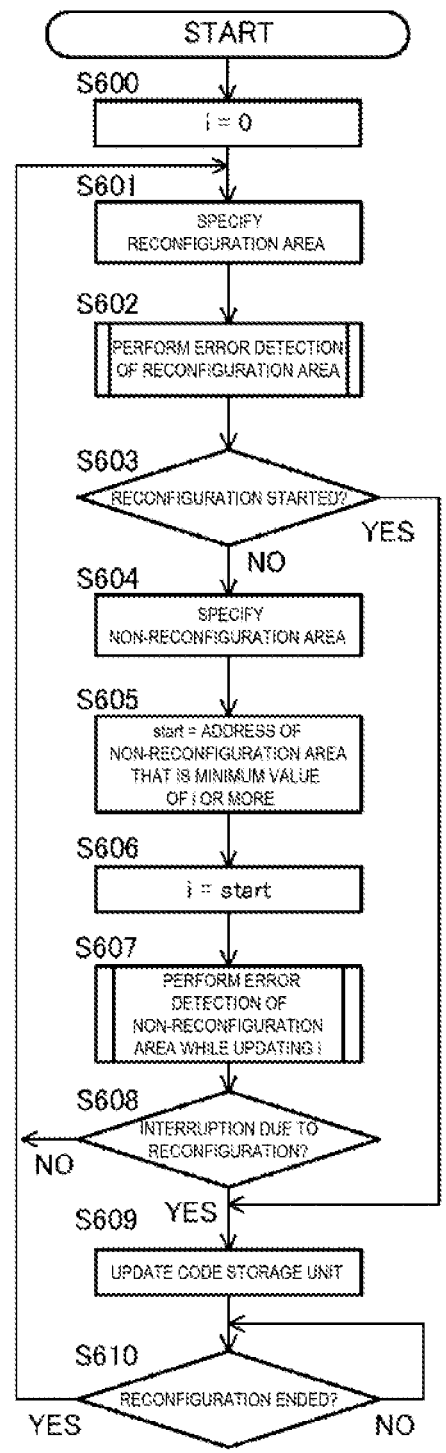

[FIG. 9]
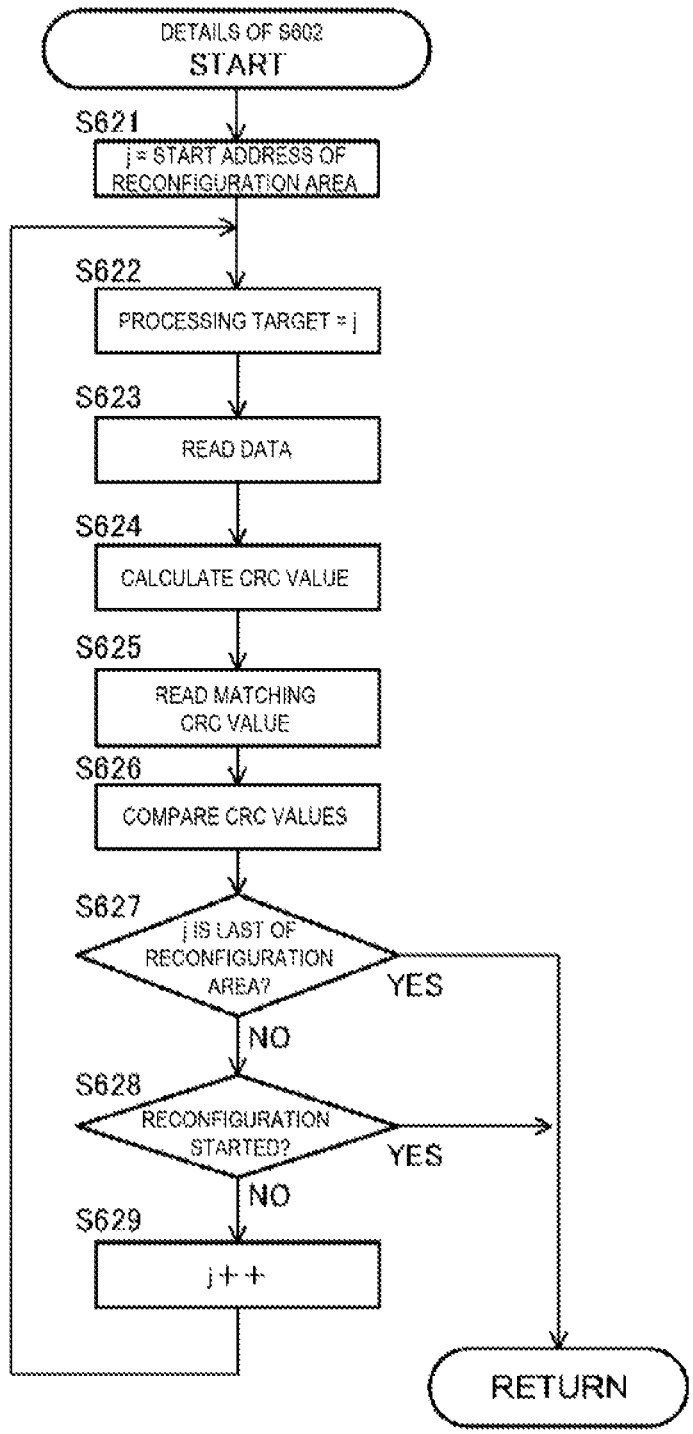

[FIG. 10]
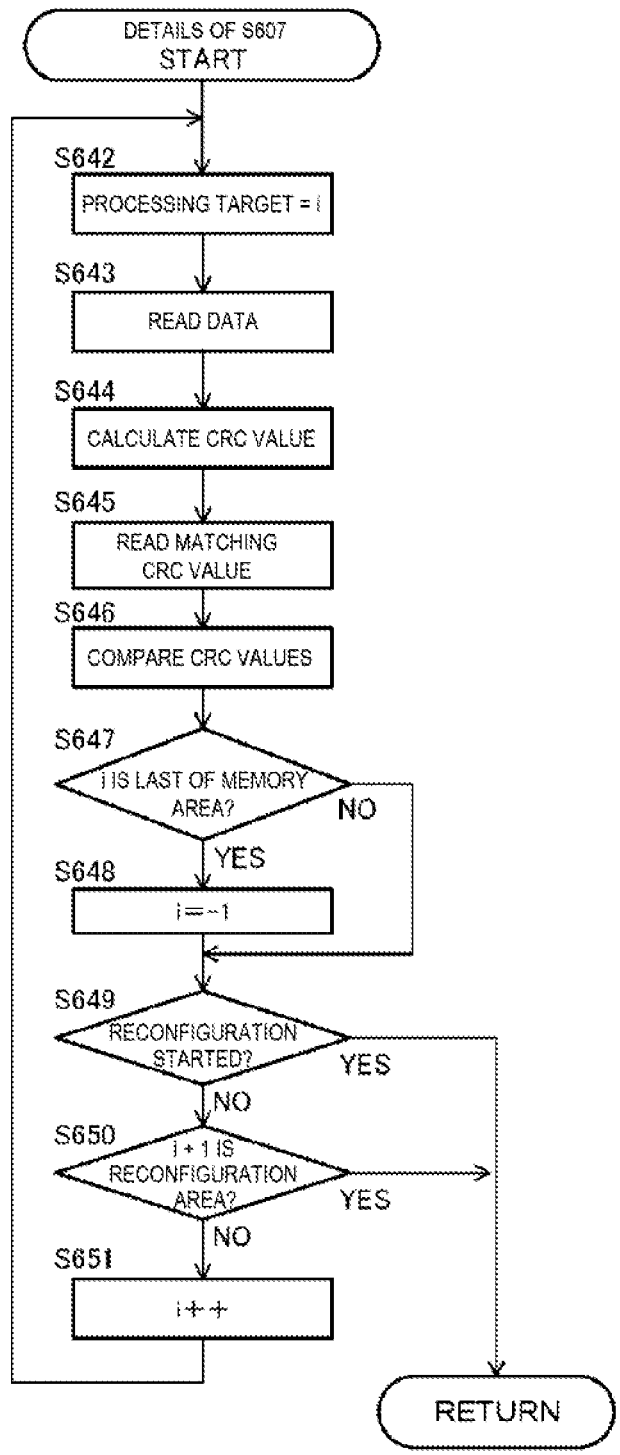

[FIG. 11]
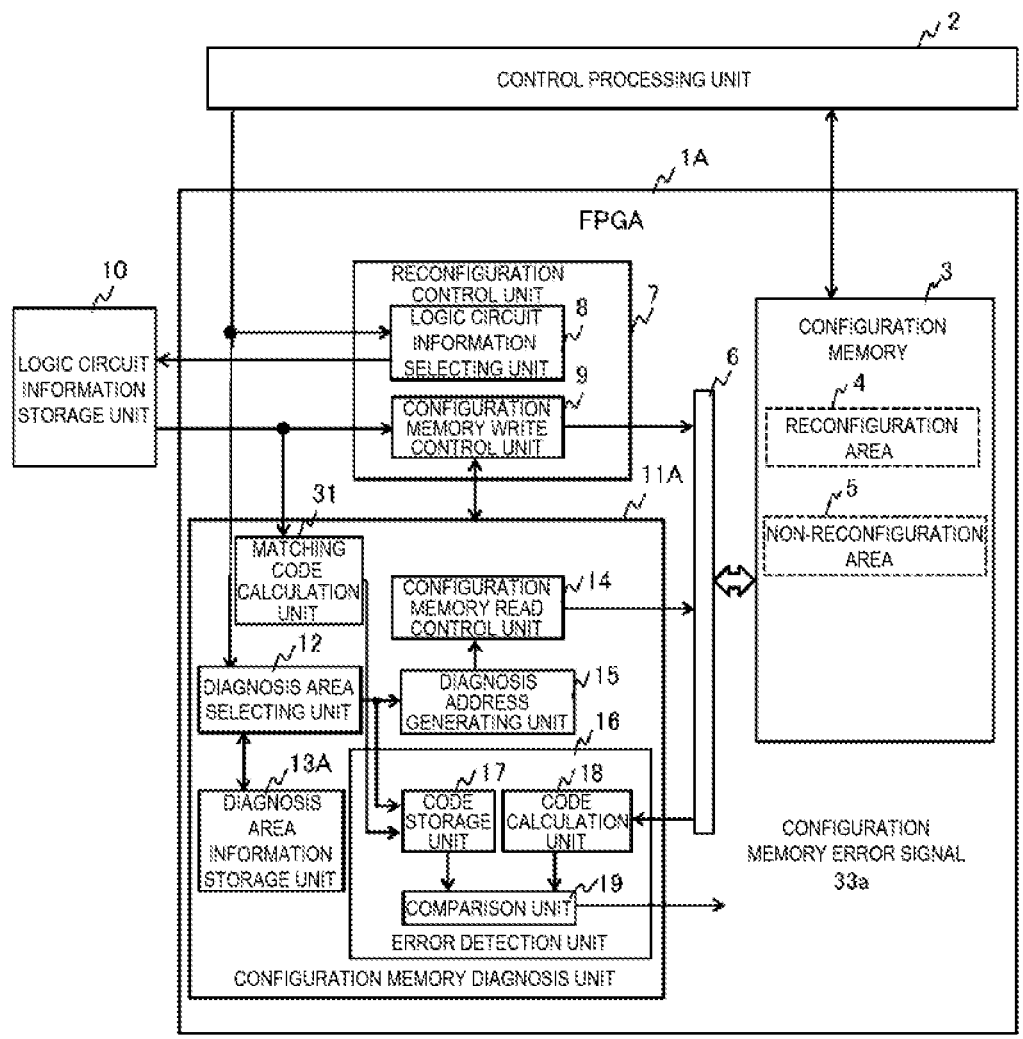

[FIG. 12]
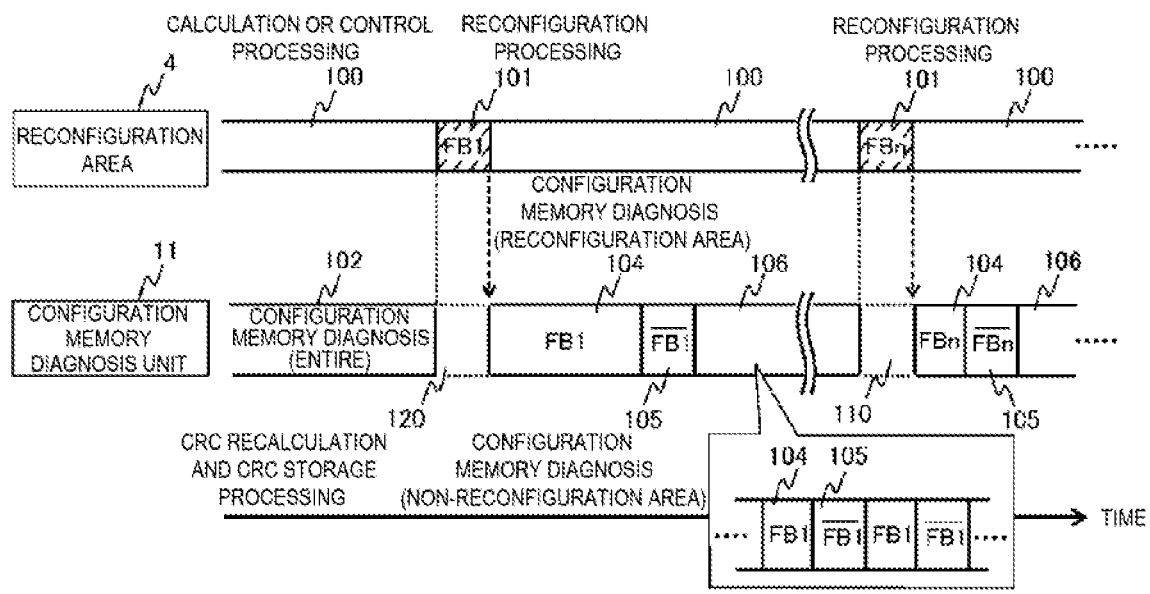
[FIG. 13]

[FIG. 14]
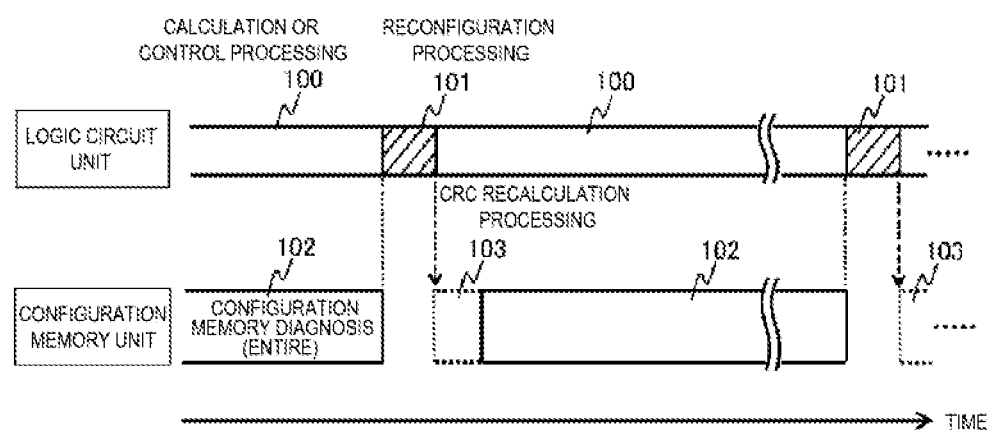

[FIG. 15]
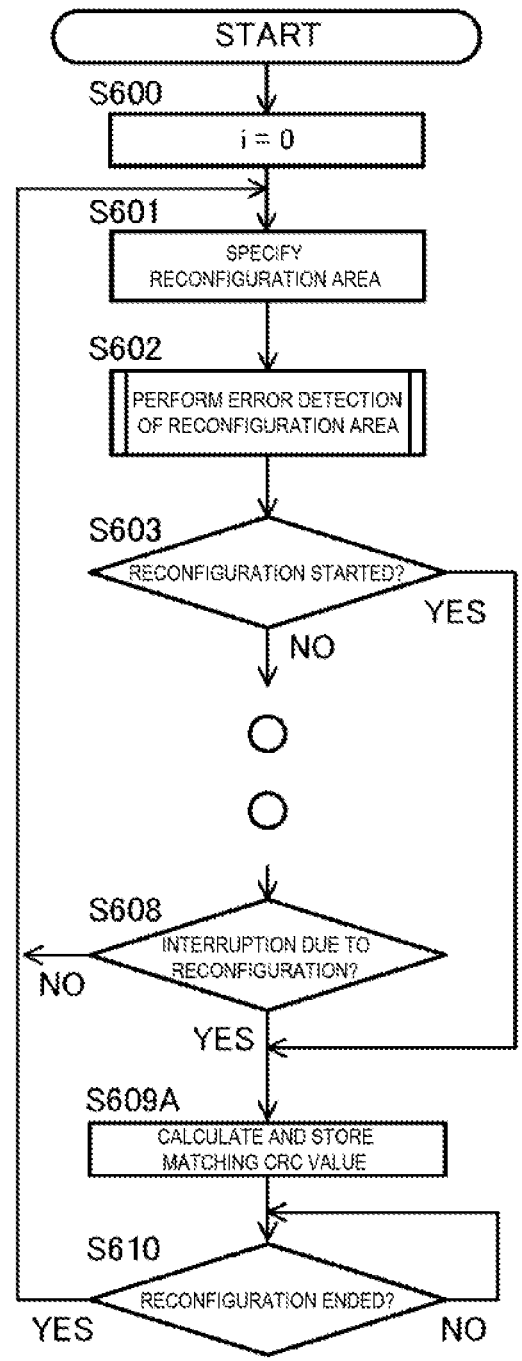

[FIG. 16]
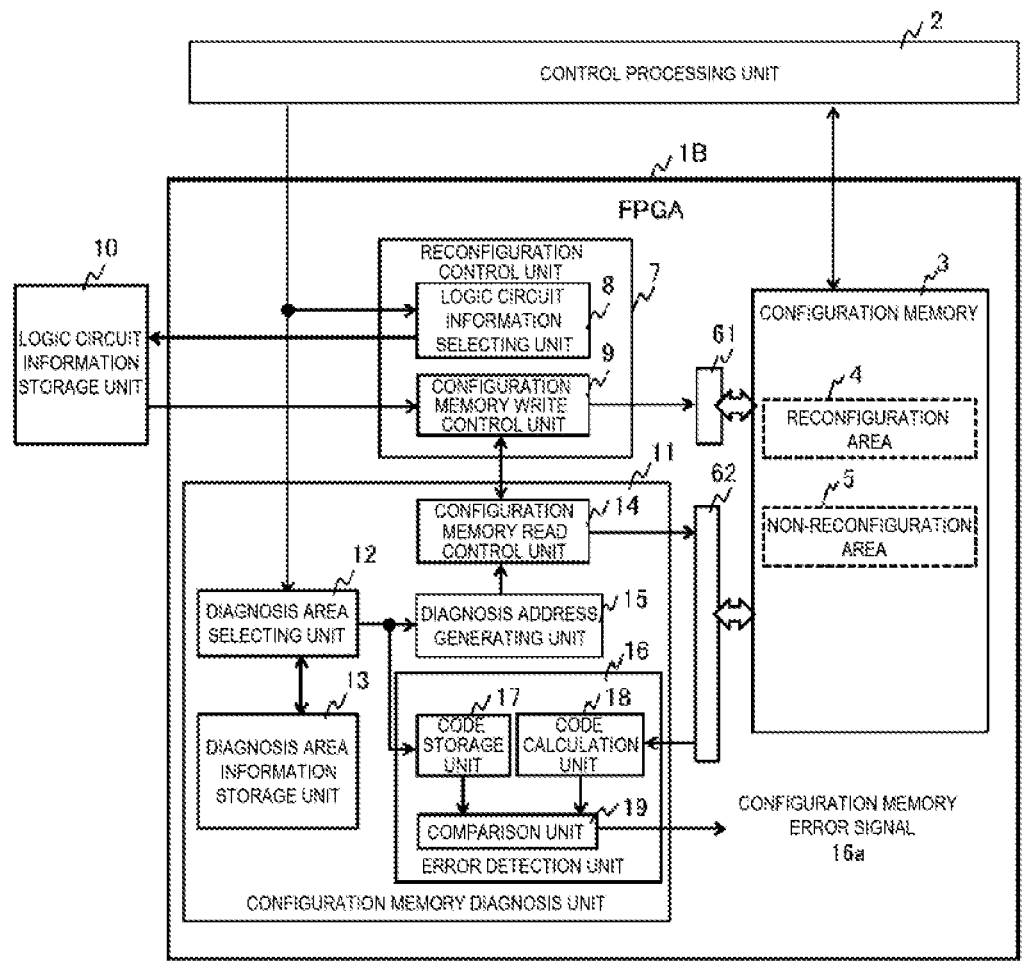

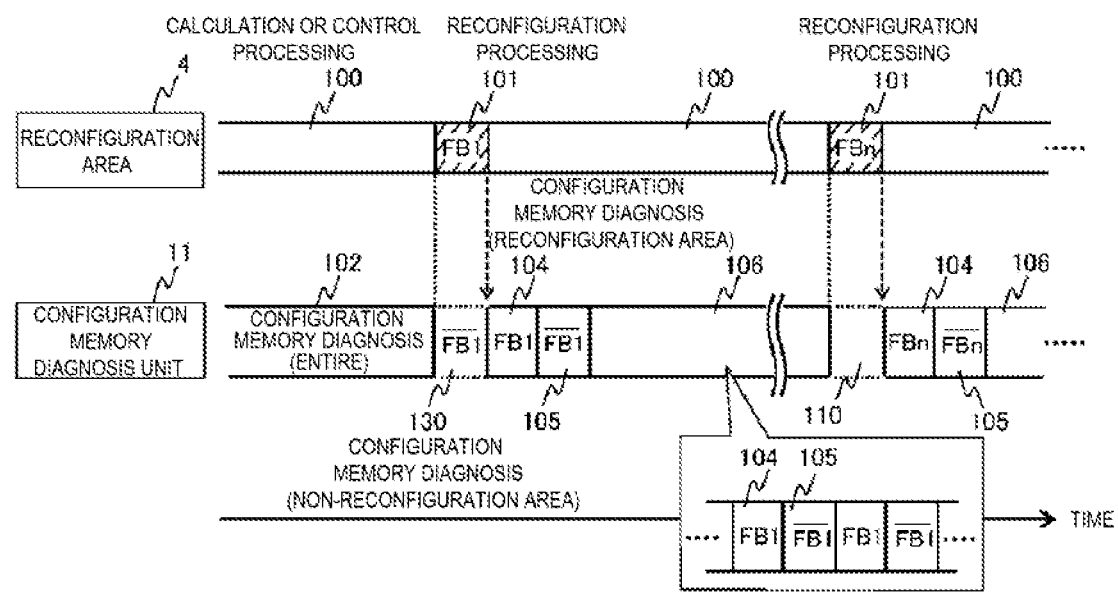
[FIG. 17]

[FIG. 18]

| | ERROR DETECTION | RECONFIGURATION |
|---|---|---|
| t1 | 0, 1, 2, ··, 50 | |
| t2 | 51, 52, 53 | 60-80 |
| t3 | 60, 61, ··, 80 | |
| t4 | 54, 55, ··, 59 | |
| t5 | 81, 82, ··, 100 | |
| t6 | 0, 1, 2, ··, 59 | |
| t7 | 60, 61, ··, 80 | |
| t8 | 81, 82, ··, 100 | |
| t9 | 0, 1, 2, ··, 59 | |
| t10 | | |

TIME

[FIG. 19]

ELECTRONIC CONTROL DEVICE AND PREFERENTIAL ERROR DETECTION METHOD OF CONFIGURATION MEMORY

TECHNICAL FIELD

The present invention relates to an electronic control device and an error detection method of a configuration memory.

BACKGROUND ART

Technology development is in progress with an aim of putting autonomous driving to practical use. The autonomous driving requires recognition, determination, and operation instead of a human, and requires advanced information processing and travel control. Further, processing performance and functions required for the autonomous driving are increasing at an accelerated rate, including AI, and in order to flexibly respond to such a demand, in addition to a CPU, a GPU, and a dedicated hardware chip in the related art, a use of a programmable device such as a field-programmable gate array (FPGA) that can freely reconfigure a logic circuit has attracted attention. In particular, in a function called dynamic reconfiguration of the FPGA, a part of the logic circuit can be changed while the device is being operated. The dynamic reconfiguration not only has an application of simple function update, but also has a merit that it is possible to implement processing originally provided as a plurality of logic circuits or a plurality of hardware on one circuit or one FPGA by replacing the logic circuits in a time division manner. Since a device size and the number of devices can be controlled, implementation of a power-saving and low-cost electronic control device can be expected. On the other hand, an in-vehicle system is required to have strict reliability based on functional safety, and an abnormality diagnosis technique is also important in an operation of the FPGA and the dynamic reconfiguration.

PTL 1 discloses a configuration device that constructs a logic circuit based on a plurality of circuit setting units in an integrated circuit by transferring circuit setting information to the plurality of circuit setting units. The configuration device includes: a circuit setting information storage memory that stores the circuit setting information; a plurality of circuit setting blocks formed by dividing each of the plurality of circuit setting units into a plurality of parts; a selecting unit that, at a time of initialization, sequentially selects one circuit setting block from the plurality of circuit setting blocks depending on a counting number of a bit counter and transfers input circuit setting information to the selected circuit setting block, and that, when identification information for specifying the circuit setting block is input, selects one circuit setting block from the plurality of circuit setting blocks based on the identification information and transfers the input circuit setting information to one of the circuit setting units of the selected circuit setting block; and a setting information control unit that, when the identification information is input, reads circuit setting information corresponding to the identification information among the circuit setting information stored in the circuit setting information storage memory based on a correspondence table in which the circuit setting information for each circuit setting block and the identification information for identifying the circuit setting block are associated with each other, and performs control to output to the selecting unit.

CITATION LIST

Patent Literature

PTL 1: JP-A-2011-013829

SUMMARY OF INVENTION

Technical Problem

The invention described in PTL 1 has room for improvement in reliability.

Solution to Problem

An electronic control device according to a first aspect of the invention includes a rewritable configuration memory composed of a plurality of frames in which logic circuit information is stored, a reconfiguration control unit configured to rewrite the logic circuit information of the frames, a logic unit configured to form a logic circuit based on the logic circuit information stored in the frames, and a configuration memory diagnosis unit configured to read the logical circuit information stored in the frames of the configuration memory and to perform error detection which is detection of an error in the stored logic circuit information, in which when the frames are rewritten by the reconfiguration control unit, the configuration memory diagnosis unit performs the error detection of ones of the frames that are rewritten prior to ones of the frames that are not rewritten.

An error detection method of a configuration memory according to a second aspect is an error detection method of a rewritable configuration memory composed of a plurality of frames. The method includes: when the frames constituting the configuration memory are rewritten, performing the error detection of ones of the frames that are rewritten prior to ones of the frames that are not rewritten.

Advantageous Effects of Invention

According to the invention, reliability can be improved.

BRIEF DESCRIPTION OF DRAWINGS

FIG. 1 is a diagram showing a hardware configuration of an FPGA.

FIG. 2 is a conceptual diagram showing frames of a configuration memory 3.

FIG. 3 is a diagram showing a functional configuration of an FPGA 1.

FIG. 4 is a diagram showing an example of a code storage unit 17.

FIG. 5 is a diagram showing an example of a diagnosis area information storage unit 13.

FIG. 6 is a sequence diagram showing a reconfiguration area 4 and a configuration memory diagnosis unit 11.

FIG. 7 is a diagram showing an operation example of the configuration memory diagnosis unit 11 in a first embodiment.

FIG. 8 is a flowchart showing operations of the configuration memory diagnosis unit 11.

FIG. 9 is a diagram showing details of S602 in FIG. 8.

FIG. 10 is a diagram showing details of S607 in FIG. 8.

FIG. 11 is a diagram showing a functional configuration of an FPGA 1A according to a second embodiment.

FIG. 12 is a diagram showing an example of a diagnosis area information storage unit 13A according to the second embodiment.

FIG. 13 is a diagram showing a diagnostic processing sequence of the configuration memory 3 according to the second embodiment.

FIG. 14 is a diagram showing a diagnostic processing sequence of a comparative example.

FIG. 15 is a flowchart showing operations of the configuration memory diagnosis unit 11 according to the second embodiment.

FIG. 16 is a diagram showing a functional configuration of an FPGA 1B according to a third embodiment.

FIG. 17 is a diagram showing a diagnostic processing sequence of the configuration memory 3 according to the third embodiment.

FIG. 18 is a diagram showing an operation example 1 of the configuration memory diagnosis unit 11 according to the third embodiment.

FIG. 19 is a diagram showing an operation example 2 of the configuration memory diagnosis unit 11 according to the third embodiment.

DESCRIPTION OF EMBODIMENTS

First Embodiment

Hereinafter, a first embodiment of an FPGA which is an electronic control device according to the invention will be described with reference to FIGS. 1 to 10. cl Hardware Configuration FIG. 1 is a diagram showing hardware configurations of an FPGA 1 and devices connected to the FPGA 1. The FPGA 1 is connected to a control device 96, a logic circuit information storage unit 10, and an initial information storage unit 95.

The FPGA 1 includes a configuration memory 3, a logic unit 91, an interface 6, and an ASIC 93. The configuration memory 3 is a volatile memory and supports partial rewriting. The logic unit 91 is various circuit elements, and constitutes a logic circuit having various functions according to logic circuit information written in the configuration memory 3. In the configuration memory 3, as to be described below, initial logic circuit information is written at a timing when the FPGA 1 is activated, and then logic circuit information in a part of an area is rewritten. In the FPGA 1, bit information of the configuration memory 3 is used as configuration information of the logic circuit, for example, ON/OFF information of a wiring connection switch. It should be noted that there is no influence on a processing operation due to content of the configuration memory 3 being read during processing by the logic circuit.

In the present embodiment, an area that is rewritten immediately before and is the area of the configuration memory 3 is referred to as a reconfiguration area 4, and the other area of the configuration memory 3 is referred to as a non-reconfiguration area 5. That is, a distinction between the reconfiguration area 4 and the non-reconfiguration area 5 is for convenience, and there is no physical characteristic in each area. Immediately after the FPGA 1 is activated, writing is performed in the entire area, so the entire area becomes the reconfiguration area 4. Further, in the present embodiment, addresses of the configuration memory 3 are represented by integers equal to or greater than 0 and are set to serial numbers, and a maximum value thereof is known.

Hereinafter, "address" is also referred to as "address code". The address of the configuration memory 3 is given for each predetermined data length, for example, for each 1 byte or 8 bytes, and a storage area of each data length is called a "frame".

FIG. 2 is a conceptual diagram showing frames of the configuration memory 3. The configuration memory 3 is composed of a plurality of frames which are data blocks of a fixed size. In the present embodiment, names F1, F2, . . . are given to the respectively frames for convenience. Although depending on a type of the FPGA, a capacity of the configuration memory 3 and the size of the data blocks are known, so a maximum number of the frames "n" is also known. Further, the present figure shows that new logic circuit information (logic circuit number FB1) is written in the frames F2 to F4, and F2 to F4 become the reconfiguration areas 4, while the other areas become the non-reconfiguration areas 5. Returning to FIG. 1, the description will be continued.

The interface 6 is an interface that enables reading and writing to the configuration memory 3. The interface 6 in the present embodiment has a so-called 1-port configuration, and the reading and writing cannot be performed simultaneously.

In other words, while the writing is performed to any area of the configuration memory 3, the reading to any area of the configuration memory 3 is impossible. The ASIC 93 in the present embodiment is a hardware circuit that performs an initial configuration of the FPGA. When power of the FPGA 1 is turned on, the ASIC 93 starts an operation, reads the initial logic circuit information from the initial information storage unit 95, and writes the initial logic circuit information in the configuration memory 3.

The FPGA 1 in the present embodiment repeatedly performs, for example, camera processing of analyzing an image captured by a camera, laser processing of analyzing distance information obtained by a laser range finder, and integration processing of integrating output of the camera and the laser range finder. Herein, in the FPGA 1, a function of dynamic reconfiguration is used to repeat configuration of the logic unit 91 in an order of a functional block that performs the camera processing, a functional block that performs the laser processing, and a functional block that performs the integration processing.

In other words, in the configuration memory 3 of the FPGA 1, certain writing is performed so that the logic unit 91 constitutes a circuit that performs the camera processing; after the camera processing, another writing is performed so that the logic unit 91 configures a circuit that performs the laser processing; and then another writing is performed after the laser processing so that the logic unit 91 configures a circuit that performs the integration processing. At this time, the area of the configuration memory 3 in which the writing is performed is the reconfiguration area 4.

The logic circuit information storage unit 10 and the initial information storage unit 95 are read-only storage areas, so-called ROMs. Information is stored in advance in the logic circuit information storage unit 10 and the initial information storage unit 95. Logic circuit information to be written to the configuration memory 3 for reconfiguration is stored in the logic circuit information storage unit 10. That is, in the above example, logic circuit information including each of the camera processing, the laser processing, and the integration processing is stored in the logic circuit information storage unit 10. This logic circuit information is stored in association with information for identifying logic circuits from each other, for example, the logic circuit number. In the present embodiment, the logic circuit numbers are expressed as FB0, FB1, . . . , and an initial logic circuit number is FB0. Information read when the FPGA 1 is activated is stored in the initial information storage unit 95. As will be described in detail later, the initial information storage unit 95 also includes information stored in some of the storage units.

The control device 96 includes a CPU 96A that is a central electronic control device, a ROM 96B that is a read-only memory unit, and a RAM 96C that is a readable and writable memory unit. The CPU 96A loads a program stored in the ROM 96B into the RAM 96C and executes the program.

Functional Configuration

FIG. 3 is a diagram showing a functional configuration of the FPGA 1. The control device 96 includes a control processing unit 2. The control processing unit 2 is implemented by the CPU 96A of the control device 96 executing the above-mentioned program. However, the control processing unit 2 may be implemented by the ASIC or the FPGA. The control processing unit 2 performs output of a reconfiguration control signal 2a that causes the FPGA 1 to perform the reconfiguration and output of a calculation command using a reconfigured logic circuit. The reconfiguration control signal 2a includes information for specifying the logic circuit newly formed in the FPGA 1, for example, the logic circuit number.

The FPGA 1 includes a reconfiguration control unit 7 that controls the rewriting of the configuration memory 3, and a configuration memory diagnosis unit 11 that diagnoses normality of the logic circuit information written in the configuration memory 3. The reconfiguration control unit 7 and the configuration memory diagnosis unit 11 are logic circuits implemented by the logic unit 91 based on the logic circuit information stored in the non-reconfiguration area 5 of the configuration memory 3. The reconfiguration control unit 7 and the configuration memory diagnosis unit 11 are configured by reading the logic circuit information from the initial information storage unit 95 when the FPGA 1 is activated.

The reconfiguration control unit 7 includes a logic circuit information selecting unit 8 and a configuration memory write control unit 9. The logic circuit information selecting unit 8 reads the corresponding logic circuit information from the logic circuit information storage unit 10 based on the reconfiguration control signal 2a transmitted from the control processing unit 2. The configuration memory write control unit 9 writes the logic circuit information read by the logic circuit information selecting unit 8 into the configuration memory 3 via the interface 6. Further, the configuration memory write control unit 9 notifies a start of the writing to the configuration memory 3 and an end of the writing to the configuration memory diagnostic unit 11.

The configuration memory diagnosis unit 11 includes a diagnosis area selecting unit 12, a diagnosis area information storage unit 13, a configuration memory read control unit 14, a diagnosis address generating unit 15, and an error detection unit 16. The diagnosis address generating unit 15 generates an address of the configuration memory 3 to be diagnosed next by the error detection unit 16. The configuration memory diagnosis unit 11 performs continuous detection in which error detection of the frames is performed in an order of address code of the configuration memory 3 in principle, but may perform the error detection of discontinuous memory address codes as will be described later.

The configuration memory read control unit 14 reads the logic circuit information for one frame of the configuration memory 3 stored in the address generated by the diagnosis address generating unit 15. The error detection unit 16 includes a code storage unit 17, a code calculation unit 18, and a comparison unit 19. The code storage unit 17 stores a correct CRC value for each frame, which corresponds to the logic circuit information currently stored in the configuration memory 3. Hereinafter, the CRC value stored in the code storage unit 17 is referred to as a "matching CRC value", and is distinguished from a CRC value calculated by the code calculation unit 18.

Information is stored in the diagnosis area information storage unit 13 and the code storage unit 17 at the time of configuration. That is, the information to be stored in the diagnosis area information storage unit 13 and the code storage unit 17 is stored in the initial information storage unit 95 in advance. However, the information stored in the code storage unit 17 is updated as described later. Data stored in the code storage unit 17 is written from the diagnosis area selecting unit 12 except when the FPGA 1 is activated.

FIG. 4 is a diagram showing an example of the code storage unit 17. In the example shown in FIG. 4, all the frames of the configuration memory 3 are F1 to Fn, and the correct CRC values CRC1 to CRCn corresponding to the respective frames are stored in the code storage unit 17. Returning to FIG. 3, the description will be continued.

The code calculation unit 18 calculates a cyclic redundancy check (CRC) value for frame data 6a of the configuration memory 3 read by the configuration memory read control unit 14 from the configuration memory 3. As described above, since the interface 6 has a so-called 1-port configuration, simultaneous execution of the reading and the writing is impossible. Therefore, between the reconfiguration control unit 7 and the configuration memory diagnosis unit 11, a signal indicating that the reconfiguration is being performed is exchanged, and exclusive control is performed such that the reconfiguration, that is, the writing and the diagnosis, that is, the reading are not performed simultaneously.

The comparison unit 19 compares the CRC value calculated by the code calculation unit 18 with the CRC value stored in the code storage unit 17 corresponding to the address of the configuration memory 3 generated by the diagnosis address generating unit 15. When the two CRC values do not match, the comparison unit 19 outputs a configuration memory error signal 16a indicating that an error is present to the configuration memory 3. The diagnosis area information storage unit 13 is a storage area formed in the FPGA 1. The diagnosis area information storage unit 13 is created when the FPGA 1 is activated and cannot be rewritten. The CRC value corresponding to each frame in the entire area of the configuration memory 3 for each logic circuit number, and a flag indicating whether the CRC value is the same as FB0 which is an initial state are stored in the diagnosis area information storage unit 13.

FIG. 5 is a diagram showing an example of the diagnosis area information storage unit 13. FB0, FB1, . . . arranged in a row direction indicate the logic circuit numbers, and F1, F2, . . . arranged in a column direction indicate frame numbers of the configuration memory 3. Further, the diagram includes a flag row indicating whether the information stored in the frames is the same as FB0 which is the initial state for each circuit number, and a CRC column where the CRC values are stored. In the example shown here, the CRC values are described in a format of "CRCmn", where a symbol m indicates a unique number of the logic circuit, and a symbol n indicates the frame number.

In the flag column, "1" indicates that the information stored in the frame is different from FB0 which is the initial state, and "0" indicates that the information stored in the frames is the same as FB0 which is the initial state. For example, in the example shown in FIG. 5, since area values of the areas F1 and F5 in the logic circuit number FB1 are "0", and the information stored in the frames is the same as FB0 which is the initial state, the CRC values are the same as FB0. The configuration when the FPGA 1 is activated is the logic circuit number FB0, and CRC values corresponding to FB0, that is, CRC0_1, CRC0_2, CRC0_3, . . . are written in the code storage unit 17 at the time of activation.

The diagnosis area selecting unit 12 refers to the diagnosis area information storage unit 13 based on the logic circuit number included in the reconfiguration control signal 2a, so as to specify the number of a frame to be rewritten by the reconfiguration of the logic circuit, that is, the number of the frame in the reconfiguration area 4 indicated by a code 12a, and outputs the number to the diagnosis address generating unit 15. Further, the diagnosis area selecting unit 12 reads the CRC value corresponding to the logic circuit number included in the reconfiguration control signal 2a and writes the CRC value in the code storage unit 17.

The CRC value read from the diagnosis area information storage unit 13 overwrites the code storage unit 17 during the reconfiguration processing, that is, while the writing of the configuration memory 3 is performed, thereby updating the CRC value of a frame to be rewritten in the code storage unit 17. Further, when the reconfiguration is completed normally and the configuration memory diagnosis unit 11 restarts the diagnosis, the error detection of the reconfiguration area 4 is first performed, and then the diagnosis of the non-reconfiguration area 5 is performed. The reconfiguration area 4 is specified by the number of the frame of the reconfiguration area 4 indicated by the code 12a.

Sequence Diagram

FIG. 6 is a sequence diagram showing an operation concept of the reconfiguration area 4 and the configuration memory diagnosis unit 11 when the reconfiguration is performed. As described above, the reconfiguration area 4 is a name for convenience, and since the reconfiguration area 4 changes for each logic circuit number, the reconfiguration area 4 shown in FIG. 6 is conceptually shown. FIG. 6 shows a state in which time elapses from the left end to the right, and the power of the FPGA 1 is turned on at the left end. In the initial logic circuit FB0 written in the reconfiguration area 4, first, calculation is performed as indicated by a code 100, and at this time, the configuration memory diagnosis unit 11 sequentially diagnoses the entire configuration memory 3 as indicated by a code 102. Herein, when the reconfiguration processing to the logic circuit number FB1 indicated by a code 101 is performed in the reconfiguration area 4, the diagnosis of the configuration memory 3 by the configuration memory diagnosis unit 11 is interrupted, and the CRC value stored in the code storage unit 17 is updated to a value corresponding to the logic circuit number FB1.

When the reconfiguration processing 101 of the reconfiguration area 4 is completed, the logic circuit FB1 written in the reconfiguration area 4 performs calculation 100. On the other hand, the configuration memory diagnosis unit 11 first performs the diagnosis of the reconfiguration area 4 as indicated by a code 104, and then performs the diagnosis of the non-reconfiguration area 5 as indicated by a code 105. However, in a lower part of FIG. 6, the reconfiguration area 4 is represented by names of the logic circuit numbers, and the non-reconfiguration area 5 is represented by symbols in which the logic circuit numbers are overlined. Thereafter, the configuration memory diagnosis unit 11 alternately repeats diagnosis 105 of the non-reconfiguration area and diagnosis 104 of the reconfiguration area to continue diagnosis 106 of the entire configuration memory. Thereafter, the processing is repeated in a similar manner. A reason why the entire configuration memory is targeted for diagnosis without being aware of the areas in the code 102 is that FB0 shown in FIG. 5 is selected immediately after the power of the FPGA 1 is turned on, and the entire configuration memory becomes the reconfiguration area 4.

Operation Example

FIG. 7 is a diagram showing an operation example of the configuration memory diagnosis unit 11 in the first embodiment. In the operation example, the frame numbers of the configuration memory are 0 to 100, and the reconfiguration area is fixed to 60 to 80. FIG. 7 shows a state in which time elapses from a top to a bottom.

The configuration memory diagnosis unit 11 starts the error detection of the configuration memory 3 from a frame number 0 to 1, 2, and 3 to sequentially perform the continuous detection from a time point t1. At a time point t2, the reconfiguration control unit 7 starts the reconfiguration of the configuration memory 3, and therefore the configuration memory diagnosis unit 11 interrupts the continuous detection. The frame numbers 60 to 80 are rewritten by the reconfiguration. When the rewriting is ended at a time point t3, the configuration memory diagnosis unit 11 gives a priority to the error detection of the frame numbers 60 to 80 which are the reconfiguration area. Further, when the error detection of the reconfiguration area is ended, the configuration memory diagnosis unit 11 restarts the error detection from a position interrupted at the time point t2, that is, a frame number 51.

Further, since when the error detection is ended up to a frame number 59 at a time point t5, the error detection is previously performed in the frame numbers 60 to 80 as the reconfiguration area, the error detection is restarted from a frame number 81, and error detection of a last frame number 100 is completed at a time point t6. Next, the configuration memory diagnosis unit 11 repeats the error detection of frame numbers 0 to 59, 60 to 80, and 81 to 100, as in the previous case. It should be noted that although the operation ends at a time point t11 in FIG. 7, the error detection is similarly repeated thereafter.

Flowchart

FIG. 8 is a flowchart showing operations of the configuration memory diagnosis unit 11. An execution subject of each step to be described below is the logic unit 91 constituting the configuration memory diagnosis unit 11. The configuration memory diagnosis unit 11 first substitutes zero into a variable i in S600. In subsequent S601, the configuration memory diagnosis unit 11 specifies the reconfiguration area 4, that is, an area in the configuration memory 3 that was rewritten immediately before. In subsequent S602, the configuration memory diagnosis unit 11 performs the error detection of the reconfiguration area specified in S601. Details of S602 will be described below. In S603 executed after S602, the configuration memory diagnosis unit 11 determines whether the reconfiguration is started, that is, whether the start of the writing from the configuration memory write control unit 9 to the configuration memory 3 is received. The processing proceeds to S609 when the configuration memory diagnosis unit 11 determines that the reconfiguration is started, and proceeds to S604 when it is determined that the reconfiguration is not started.

In S604, the configuration memory diagnosis unit 11 specifies the non-reconfiguration area 5. In subsequent S605, the configuration memory diagnosis unit 11 substitutes an address of the non-reconfiguration area which is equal to or greater than a value of the variable i into a variable start. In subsequent S606, the configuration memory diagnosis unit 11 substitutes a value of the variable start, whose value is updated in S605, into the variable i. In subsequent S607, the configuration memory diagnosis unit 11 performs memory diagnosis of the non-reconfiguration area 5 while updating the variable i. Details of the present step will be described later. In subsequent S608, the configuration memory diagnosis unit 11 determines whether the reconfiguration is started, that is, whether the start of the writing from the configuration memory write control unit 9 to the configuration memory 3 is received. The configuration memory diagnosis unit 11 proceeds to S609 when it is determined that the reconfiguration is started, and returns to S601 when it is determined that the reconfiguration is not started.

In S609 which is performed when a positive determination is made in S603 or S608, the configuration memory diagnosis unit 11 reads the CRC value corresponding to the logic circuit number included in the reconfiguration control signal 2a and writes the CRC value in the code storage unit 17. In S610 which is performed subsequent to S609, the configuration memory diagnosis unit 11 determines whether the reconfiguration is completed, in other words, whether the end of the writing from the configuration memory write control unit 9 to the configuration memory 3 is received. The configuration memory diagnosis unit 11 returns to S601 when it is determined that the reconfiguration is completed, and remains in S610 when it is determined that the reconfiguration is not started.

Details of S602

FIG. 9 is a diagram showing the details of S602 in FIG. 8. In S621, the configuration memory diagnosis unit 11 substitutes a start address of the reconfiguration area into a variable j. It should be noted that the variable j is referred to only in the processing shown in FIG. 9, and is not linked with the variable i described in FIGS. 8 and 10. In subsequent S622, the configuration memory diagnosis unit 11 sets processing targets of S623 to S626 as an area of the address j. In subsequent S623, the configuration memory diagnosis unit 11 causes the code calculation unit 18 to read data from processing target area of the configuration memory 3. In S624, the configuration memory diagnosis unit 11 causes the code calculation unit 18 to calculate a CRC value based on the data read in S623. In subsequent S625, the configuration memory diagnosis unit 11 reads the matching CRC value corresponding to the processing target area from the code storage unit 17.

In subsequent S626, the configuration memory diagnosis unit 11 causes the comparison unit 19 to compare the CRC value calculated in S624 with the CRC value read in S625, and performs the diagnosis of the configuration memory 3. If the CRC value calculated in S624 and the CRC value read in S625 do not match, the comparison unit outputs the configuration memory error signal 16a. In subsequent S627, the configuration memory diagnosis unit 11 determines whether a value of the variable j is a last address of the reconfiguration area, and when it is determined that the value of the variable j is the last, the processing of FIG. 9 is ended, and when it is determined that the value of the variable j is not the last, the processing proceeds to S628. In S628, the configuration memory diagnosis unit 11 determines whether the reconfiguration is started, that is, whether the start of the writing from the configuration memory write control unit 9 to the configuration memory 3 is received. The configuration memory diagnosis unit 11 ends the processing in FIG. 9 when it is determined that the reconfiguration is started, and proceeds to S629 when it is determined that the reconfiguration is not started. In S629, the configuration memory diagnosis unit 11 increments j, that is, increases j by 1 and returns to S622. The above is the details of S602.

Details of S607

FIG. 10 is a diagram showing the details of S607 in FIG. 8. In S642, the configuration memory diagnosis unit 11 sets processing targets of S643 to S646 as the area of the address of the variable i in the configuration memory 3. The variable i is the same as the variable i in FIG. 8, and when the value is updated in FIG. 10, the updated value can be referred to also in FIG. 8. In subsequent S643, the configuration memory diagnosis unit 11 causes the code calculation unit 18 to read the data from the processing target area of the configuration memory 3. In S644, the configuration memory diagnosis unit 11 causes the code calculation unit 18 to calculate the CRC value based on the data read in S643. In subsequent S645, the configuration memory diagnosis unit 11 reads the matching CRC value corresponding to the processing target area from the code storage unit 17.

In subsequent S646, the configuration memory diagnosis unit 11 causes the comparison unit 19 to compare the CRC value calculated in S644 with the CRC value read in S645, and performs the diagnosis of the configuration memory 3. If the CRC value calculated in S644 and the CRC value read in S645 do not match, the comparison unit outputs the configuration memory error signal 16a. In subsequent S647, the configuration memory diagnosis unit 11 determines whether the value of the variable i is the last address of the configuration memory 3, and when it is determined that the variable i is the last, the processing proceeds to S648, and "−1" is substituted into i, which is called reset, and when it is determined that the variable i is not the last, the processing proceeds to S649. Herein, a reason why "−1" is substituted is that i becomes "0" when incremented in S651 to be described later. As described above, the start address code of the configuration memory 3 is "0", and the value of the variable i is reset in S648, so that the processing can be performed from the start address code.

In S649, the configuration memory diagnosis unit 11 determines whether the reconfiguration is started, that is, whether the start of the writing from the configuration memory write control unit 9 to the configuration memory 3 is received. The configuration memory diagnosis unit 11 ends the processing in FIG. 10 when it is determined that the reconfiguration is started, and proceeds to S650 when it is determined that the reconfiguration is not started. If a positive determination is made in S649, the processing returns to FIG. 8 and the same processing as in S649 is performed in the next step S608. Such description is because that it is difficult to express a so-called return value for the convenience of drawing the flowchart, and S649 or S608 can be omitted by integrating FIG. 10 with FIG. 8.

In S650, the configuration memory diagnosis unit 11 determines whether an address i+1 is included in the reconfiguration area. When it is determined that the address i+1 is included in the reconfiguration area, the processing shown in FIG. 10 is ended, and when it is determined that the address i+1 is not included in the reconfiguration area, the processing proceeds to S651. In S651, the configuration memory diagnosis unit 11 increments j, that is, increases j by 1 and returns to S642. The above is the details of S607.

According to the first embodiment described above, the following operation and effect are obtained.

(1) The FPGA 1 includes: the rewritable configuration memory 3 composed of the plurality of frames in which the logic circuit information is stored; the reconfiguration control unit 7 configured to rewrite the logic circuit information of the frames; the logic unit 91 configured to form the logic circuit based on the logic circuit information stored in the frames; and the configuration memory diagnosis unit 11 configured to read the logical circuit information stored in the frames of the configuration memory 3 and to perform error detection which is detection of an error in the stored logic circuit information. When the frames are rewritten by the reconfiguration control unit 7, the configuration memory diagnosis unit 11 performs the error detection of ones of the frames that are rewritten, that is, the reconfiguration area 4. Therefore, when the configuration memory 3 is rewritten, since the FPGA 1 performs the error detection of the reconfiguration area 4 prior to the non-reconfiguration area 5, reliability of the FPGA 1, particularly the reconfiguration processing, can be improved.

Further, in the present embodiment, the information stored in the diagnosis area information storage unit 13, that is, the matching CRC value for each logic circuit number and each frame is stored in advance in the initial information storage unit 95. Therefore, since the comparison unit 19 only needs to copy the CRC value used for matching from the diagnosis area information storage unit 13 to the code storage unit 17, the error detection of the configuration memory 3 can be started quickly without the need of calculation. Therefore, time during which the configuration memory cannot be diagnosed during the operation of the FPGA 1 can be shortened, and the reliability of the FPGA 1 can be improved.

(2) The configuration memory diagnosis unit 11 performs the error detection of the ones of the frames that are rewritten at the same time when the reconfiguration control unit 7 completes the rewriting of the frames. When the interface 6 provided in the FPGA 1 has a so-called 1-port configuration, and the writing and the reading cannot be performed simultaneously, the error detection cannot be performed during the writing. Therefore, the configuration memory diagnosis unit 11 starts the error detection at the same time as the end of the writing which is the earliest timing, so that time during which the error detection is not performed after the reconfiguration is shortened as much as possible, and the reliability of the reconfiguration processing can be improved.

(3) The configuration memory diagnosis unit 11 performs the continuous detection in which the error detection of the frames is performed in the order of address code of the configuration memory 3 until the reconfiguration control unit 7 performs the rewriting, and when the reconfiguration control unit 7 performs the rewriting, interrupts the continuous detection and performs the error detection of the reconfiguration area 4 which is ones of the frames rewritten by the reconfiguration control unit 7. Further, when the error detection of the reconfiguration area 4 is completed, the configuration memory diagnosis unit 11 restarts the continuous detection from one of the frames at which the interruption occurs. Therefore, even when the reconfiguration is frequently performed, the error detection of the non-reconfiguration area 5 can be sequentially performed during a gap time. In other words, it is possible to reduce the frames in which the error detection is not performed for a long time in the non-reconfiguration area 5.

Modification 1

In the above-described first embodiment, the CRC is used as the error detection code. However, the code is not limited to CRC as long as the code can detect the error. Further, a code capable of not only detecting the error but also correcting the error can be used. For example, any of an md5, a parity bit, and a checksum may be used instead of the CRC.

Second Embodiment

A second embodiment of the FPGA as the electronic control device according to the invention will be described with reference to FIGS. 11 to 13. In the following description, the same components as those of the first embodiment are denoted by the same reference numerals, and differences will be mainly described. The points not specifically described are the same as those of the first embodiment. The present embodiment differs from the first embodiment mainly in that the matching CRC value is calculated.

Functional Configuration

FIG. 11 is a diagram showing a functional configuration of an FPGA 1A according to the second embodiment. The FPGA 1A includes a matching code calculation unit 31 that calculates the matching CRC value, in addition to the configuration of the FPGA 1 in the first embodiment. The matching code calculation unit 31 operates when the reconfiguration processing is performed in the reconfiguration area 4, calculates the CRC value for frame data read from the logic circuit information storage unit 10, and overwrites the CRC value in the code storage unit 17. That is, in the present embodiment, the matching CRC value corresponding to each frame except an initial state may not be stored in the diagnostic area information storage unit 13A.

FIG. 12 is a diagram showing an example of the diagnostic area information storage unit 13A according to the second embodiment. A configuration of the diagnostic area information storage unit 13A is the same as that of the diagnosis area information storage unit 13 shown in FIG. 5 in the first embodiment. However, a difference is that, except for the logic circuit number FB0 which is the initial state, CRC values with a value of a flag column being "1" are not stored. In FIG. 12, CRC values of frames in which the value of the flag column is "0" are stored, but since these CRC values are the same as the values of the logic circuit number FB0 and thus can be obtained by referring to the value of the logic circuit number, the CRC values may not be stored. However, the values of the flag column are mandatory.

Sequence Diagram

FIG. 13 is a diagram showing a diagnostic processing sequence of the configuration memory 3 according to the second embodiment. A difference between FIG. 6 shown in the first embodiment and FIG. 13 is that when reconfiguration processing is performed in the reconfiguration area 4, the CRC value is calculated and stored in the code storage unit 17 as indicated by a code 120. Operations other than the point are similar to those of the first embodiment.

Sequence Diagram of Comparative Example

FIG. 14 is a diagram showing a diagnostic processing sequence of a comparative example. In the comparative example, after the reconfiguration processing indicated by the code 101 is completed, matching CRC calculation processing indicated by a code 103 is started. Therefore, there is a problem that the start of diagnosis of the configuration memory 3 is delayed by the time indicated by the code 103.

Flowchart

FIG. 15 is a flowchart showing operations of the configuration memory diagnosis unit 11 according to the second embodiment. Since FIG. 15 has many operations in common with FIG. 8 in the first embodiment, differences will be described below. In FIG. 15, S609A is performed instead of S609. That is, when a positive determination is made in S603 or S608, the configuration memory diagnosis unit 11 performs S609A. In S609A, the configuration memory diagnosis unit 11 receives the logic circuit information of each frame written in the configuration memory 3 from the logic circuit information storage unit 10 similarly to the configuration memory write control unit 9, and calculates the CRC value of each frame. Further, the calculated CRC value is stored in a corresponding area of the code storage unit 17 as the matching CRC value, and the processing proceeds to S610.

According to the second embodiment described above, the following operation and effect are obtained.

(4) The configuration memory diagnosis unit 11 includes the code calculation unit 18 configured to calculate the error detection code using the logic circuit information written in the frames and the comparison unit 19 configured to determine whether the error detection code calculated by the code calculation unit 18 matches a matching error detection code calculated in advance. The FPGA 1A includes the matching code calculation unit 31 configured to, when the reconfiguration control unit 7 writes the logic circuit information in the configuration memory 3, calculate an error code using the logic circuit information written by the reconfiguration control unit 7 and record the error code as the matching error detection code. Therefore, since it is not necessary to store the matching CRC value in the reconfiguration area 4 in the initial information storage unit 95 in advance, the initial information storage unit 95 can be easily created.

Modification 1 of Second Embodiment

The calculation of the CRC value by the matching code calculation unit 31 may be performed only once a day or once each time power is turned on. At this time, the CRC value calculated by the matching code calculation unit 31 is stored in the diagnostic area information storage unit 13A. Further, in order to determine whether the calculation by the matching code calculation unit 31 is necessary, a flag to be initialized once a day or when the power is turned on can be prepared for each frame, and the frame in which the CRC value is calculated can be implemented by setting the flag.

Modification 2 of the Second Embodiment

Logic circuit information stored in the logic circuit information storage unit 10 may be updated as appropriate. For the update, for example, a communication device (not shown) is used, and the logic circuit information in the logic circuit information storage unit 10 is updated by wireless communication. Even if the logic circuit information is updated, since CRC values other than the logic circuit number FB0 which is an initial state are not stored in the initial information storage unit 95, there is no need to update the initial information storage unit 95, and the update processing is simple. It should be noted that when the initial information storage unit 95 is also updated, it is necessary to calculate the CRC value in consideration of a size of the frame which may be different for each model and complex processing is required, but the present modification also has an advantage that there is no such annoyance.

Third Embodiment

A third embodiment of the FPGA which is the electronic control device according to the invention will be described with reference to FIGS. 16 to 19. In the following description, the same components as those of the first embodiment are denoted by the same reference numerals, and differences will be mainly described. The points not specifically described are the same as those of the first embodiment. The present embodiment differs from the first embodiment mainly by including two interfaces.

Functional Configuration

FIG. 16 is a diagram showing a functional configuration of an FPGA 1B according to the third embodiment. The FPGA 1B includes one interface added to the configuration of the FPGA 1 in the first embodiment. More precisely, the interface 6 is deleted, and a write interface 61 and a read interface 62 are added. Therefore, reconfiguration processing and diagnosis of the configuration memory 3 can be performed in parallel. However, since the writing and the reading cannot be performed for the same frame, the non-reconfiguration area 5 is diagnosed during the reconfiguration processing.

Sequence Diagram

FIG. 17 is a diagram showing a diagnostic processing sequence of the configuration memory 3 according to the third embodiment. A difference between FIG. 6 shown in the first embodiment and FIG. 17 is that when the reconfiguration processing 101 is performed in the reconfiguration area 4, the diagnosis of the non-reconfiguration area 5 is performed as indicated by a code 130. Operations other than the point are similar to those of the first embodiment.

Operation Example 1

FIG. 18 is a diagram showing an operation example 1 of the configuration memory diagnosis unit 11 according to the third embodiment. In the operation example, the frame number of the configuration memory is 0 to 100, and the frame number of the reconfiguration area is 60 to 80. FIG. 18 shows a state in which time elapses from a top to a bottom.

The configuration memory diagnosis unit 11 starts the error detection of the configuration memory 3 from the frame number 0 to 1, 2, and 3 to sequentially perform the error detection from the time point t1, and the error detection is completed up to the frame number 50 by the time point t2. At the time point t2, the reconfiguration control unit 7 starts the reconfiguration of the configuration memory 3, and the configuration memory diagnosis unit 11 continues the error detection. Since frame numbers to be reconfigured are 60 or later and the processing target of the configuration memory diagnosis unit 11 is 51, the configuration memory diagnosis unit 11 directly completes the error detection up to the frame numbers 52 and 53. The reconfiguration is completed at the time point t3, and the frame numbers 60 to 80 are rewritten.

The configuration memory diagnosis unit 11 completes the error detection up to the frame number 53 by the time point t3, and performs the error detection for the frame number 54 at the time point t3. Since the reconfiguration is completed, the configuration memory diagnosis unit 11 interrupts the error detection of the frame number 54 and performs the error detection of the frame numbers 60 to 80 which are the reconfiguration area. Further, when the error detection of the reconfiguration area is ended, the configuration memory diagnosis unit 11 restarts the error detection from a position at which the interruption occurs at the time point t3, that is, the frame number 54. Further, when the error detection is completed up to the frame number 59, the reconfiguration area is excluded and the error detection is restarted from the frame number 81. Since the following is similar to the operation example of the first embodiment, description thereof will be omitted.

Operation Example 2

FIG. 19 is a diagram showing an operation example 2 of the configuration memory diagnosis unit 11 according to the third embodiment. In the operation example, the frame number of the configuration memory is 0 to 100, and the frame number of the reconfiguration area is 50 to 80. FIG. 19 shows a state in which time elapses from a top to a bottom.

The configuration memory diagnosis unit 11 starts the error detection of the configuration memory 3 from the frame number 0 to 1, 2, and 3 to sequentially perform the error detection from the time point t1, and the error detection is completed up to the frame number 70 by the time point t2. At the time point t2, the reconfiguration control unit 7 starts the reconfiguration of the configuration memory 3, and the configuration memory diagnosis unit 11 continues the error detection. Since frame numbers to be reconfigured are 60 to 80 and the processing target of the configuration memory diagnosis unit 11 is 71, the error detection is performed from 81 which is the smallest frame number larger than the immediately preceding processing target except for the reconfiguration area. Until the time point t3 when the reconfiguration control unit 7 completes the reconfiguration, the configuration memory diagnosis unit 11 completes the error detection of the frame numbers 81 to 83.

The configuration memory diagnosis unit 11 performs the error detection in the frame numbers 60 to 80 which are the reconfiguration area from the time point t3. The error detection has already been performed to the frame numbers 60 to 70 up to the time point t2, but since the frame numbers 60 to 70 are rewritten by the reconfiguration from the time points t2 to t3, it is necessary to perform the error detection from the time point t3 in order to confirm whether the logic circuit information after the rewriting is normal. When the error detection of the frame number 80 is completed at a time point t4, the configuration memory diagnosis unit 11 performs the error detection from the frame number 84. Since the following is similar to the operation example of the first embodiment, description thereof will be omitted.

According to the third embodiment described above, the following operation and effect are obtained.

(5) While the reconfiguration control unit 7 performs the rewriting, the configuration memory diagnosis unit 11 performs the error detection of ones of the frames that are not rewritten by the reconfiguration control unit 7. Therefore, in the so-called 2-port FPGA 1B, the error detection is not interrupted even while the configuration memory 3 is being rewritten, so that reliability of the FPGA 1B can be further improved.

The above embodiments and modifications may be combined with each other. Although various embodiments and modifications are described above, the invention is not limited to these contents. Other embodiments conceivable within the scope of the technical idea of the invention are also included in the scope of the invention.

A disclosed content of the following priority basic application is incorporated herein by reference.

JP-A-2018-29178 (filed on Feb. 21, 2018)

REFERENCE SIGNS LIST

1 FPGA
2 control processing unit
3 configuration memory
4 reconfiguration area
5 non-reconfiguration area
7 reconfiguration control unit
10 logic circuit information storage unit
11 configuration memory diagnosis unit
16 error detection unit
17 code storage unit
18 code calculation unit
19 comparison unit
31 matching code calculation unit

The invention claimed is:

1. An electronic control device comprising:
   a rewritable configuration memory composed of a plurality of frames in which logic circuit information is stored;
   a reconfiguration control unit configured to rewrite the logic circuit information of the frames;
   a logic unit configured to form a logic circuit based on the logic circuit information stored in the frames; and
   a configuration memory diagnosis unit configured to read the logical circuit information stored in the frames of the configuration memory and configured to perform preferential error detection which is detection of an error in the stored logic circuit information, wherein
     while the reconfiguration control unit is rewriting frames, the configuration memory diagnosis unit is configured to interrupt a sequential error detection by jumping to an out of sequence frame number and performing error detection on the out of sequence frame number before returning to the sequential error detection, and
     when the error detection of the out of sequence frame number has ended, the sequential error detection restarts from a same position where detection was previously interrupted.

2. The electronic control device according to claim 1, wherein
   the configuration memory diagnosis unit performs the error detection of: i) at least one of rewritten frames before at least one of not rewritten frames, and ii) the at least one of the rewritten frames at the same time when the reconfiguration control unit completes the rewriting of the frames.

3. The electronic control device according to claim 2, wherein the configuration memory diagnosis unit includes:
- a code calculation unit configured to calculate an error detection code using the logic circuit information written in the frames; and
- a comparison unit configured to determine whether the error detection code calculated by the code calculation unit matches a matching error detection code calculated in advance, and wherein the electronic control device further includes:
- a matching code calculation unit configured to, when the reconfiguration control unit writes the logic circuit information in the configuration memory, calculate the matching error detection code using the logic circuit information written by the reconfiguration control unit.

4. The electronic control device according to claim 2, wherein while the reconfiguration control unit performs the rewriting, the configuration memory diagnosis unit performs the error detection of the at least one of ones of the not rewritten frames by the reconfiguration control unit.

5. The electronic control device according to claim 2, wherein the configuration memory diagnosis unit performs a continuous detection in which the error detection of the frames is performed in an order of address code of the configuration memory until the reconfiguration control unit performs the rewriting of the frames, and when the reconfiguration control unit performs the rewriting of the frames, interrupts the continuous detection and performs the error detection of ones of the frames that are rewritten by the reconfiguration control unit, and restarts the continuous detection from one of the frames at which the interruption occurs when the error detection of the at least one of the rewritten frames by the reconfiguration control unit is completed.

6. An error detection method for a rewritable configuration memory composed of a plurality of frames, the method comprising:

interrupting a sequential error detection, with a configuration memory diagnosis unit, while a reconfiguration control unit is rewriting frames, by jumping to an out of sequence frame number and performing error detection on the out of sequence frame number before returning to the sequential error detection; and when the error detection of the out of sequence frame number has ended, restarting the sequential error detection from a same position where detection was previously interrupted.

* * * * *